United States Patent
Lin et al.

(10) Patent No.: US 11,329,074 B2
(45) Date of Patent: May 10, 2022

(54) ARRAY SUBSTRATE, MANUFACTURING METHOD THEREOF, AND DISPLAY PANEL

(71) Applicant: SHENZHEN CHINA STAR OPTOELECTRONICS SEMICONDUCTOR DISPLAY TECHNOLOGY CO., LTD., Shenzhen (CN)

(72) Inventors: Zhenguo Lin, Shenzhen (CN); Xingyu Zhou, Shenzhen (CN); Yuanjun Hsu, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 249 days.

(21) Appl. No.: 16/619,805

(22) PCT Filed: Nov. 21, 2019

(86) PCT No.: PCT/CN2019/120035
§ 371 (c)(1),
(2) Date: Dec. 5, 2019

(87) PCT Pub. No.: WO2021/072908
PCT Pub. Date: Apr. 22, 2021

(65) Prior Publication Data
US 2021/0408083 A1    Dec. 30, 2021

(30) Foreign Application Priority Data
Oct. 16, 2019   (CN) .......................... 201910982128.5

(51) Int. Cl.
*H01L 27/00*   (2006.01)
*H01L 29/00*   (2006.01)
(Continued)

(52) U.S. Cl.
CPC ........ *H01L 27/1255* (2013.01); *H01L 27/127* (2013.01); *H01L 27/1225* (2013.01);
(Continued)

(58) Field of Classification Search
CPC ............. H01L 27/1255; H01L 27/1225; H01L 27/1237; H01L 27/127; H01L 27/1288;
(Continued)

(56) References Cited

U.S. PATENT DOCUMENTS

| 9,620,613 B2 * | 4/2017 | Park | H01L 29/4908 |
| 2008/0073686 A1 | 3/2008 | Kuo | |
| 2016/0020266 A1 * | 1/2016 | Park | H01L 29/4908 |
| | | | 257/40 |

FOREIGN PATENT DOCUMENTS

| CN | 102290421 A | 12/2011 |
| CN | 103904086 A | 7/2014 |

(Continued)

*Primary Examiner* — Nikolay K Yushin
(74) *Attorney, Agent, or Firm* — JMB Davis Ben-David

(57) ABSTRACT

An array substrate, a manufacturing method thereof, and a display panel. The array substrate includes a light-emitting area and a non-light-emitting area. The array substrate comprises: a substrate; a gate insulating layer comprising a first gate insulating layer and a second gate insulating layer disposed on the substrate in sequence; and a storage capacitor disposed in the light-emitting area and comprising a first transparent electrode and a second transparent electrode. Wherein the first transparent electrode is disposed between the first gate insulating layer and the second gate insulating layer, and the second transparent electrode is disposed on the second gate insulating layer.

12 Claims, 5 Drawing Sheets

(51) Int. Cl.
*H01L 27/12* (2006.01)
*H01L 29/66* (2006.01)
*H01L 29/786* (2006.01)

(52) U.S. Cl.
CPC ...... *H01L 27/1237* (2013.01); *H01L 27/1288* (2013.01); *H01L 29/66969* (2013.01); *H01L 29/7869* (2013.01)

(58) Field of Classification Search
CPC .......... H01L 29/66969; H01L 29/7869; H01L 29/1037; H01L 29/78; H01L 29/4232; H01L 29/7865; H01L 29/78696
See application file for complete search history.

(56) References Cited

FOREIGN PATENT DOCUMENTS

| | | |
|---|---|---|
| CN | 105514116 A | 4/2016 |
| CN | 109166896 A | 1/2019 |

\* cited by examiner

ARRAY SUBSTRATE, MANUFACTURING METHOD THEREOF, AND DISPLAY PANEL

CROSS-REFERENCE TO RELATED APPLICATIONS

This is the U.S. National Stage of International Patent Application No. PCT/CN2019/120035, filed Nov. 21, 2019, which in turn claims the benefit of Chinese Patent Application No. 201910982128.5, filed Oct. 16, 2019.

FIELD OF INVENTION

The present disclosure relates to the field of display panel technologies, and more particularly to an array substrate, a manufacturing method thereof, and a display panel.

BACKGROUND OF INVENTION

Current liquid crystal displays (LCDs) and organic light-emitting diodes (OLEDs) have their own advantages, and are widely used in display devices. LCDs and OLEDs all include an array substrate, and control each pixel by thin film transistors (TFTs) in the array substrate. Wherein, thin film transistors generally comprise a gate electrode, an active layer, a source electrode, and a drain electrode. To be more specifically, a structure of thin film transistors can be a bottom gate type or a top gate type.

Technical Problem

Because a region for thin film transistors and capacitors in display panels with large sizes and high resolution occupies a great proportion and a structure of thin film transistors is opaque, it causes a reduced pixel aperture ratio. A current method is to reduce the proportion occupied by the region for thin film transistors and capacitors. However, capacitors and thin film transistors need a predetermined size to ensure their functions, so there is a limited range to reducing sizes.

Therefore, it is necessary to provide a new type of array substrate to solve the above problems.

SUMMARY OF INVENTION

The present disclosure provides an array substrate, a manufacturing method thereof, and a display panel. The array substrate can improve pixel aperture ratio, yield, and resolution when applied to display panels.

To solve the above problems, an embodiment of the present disclosure provides technical solutions as following:

The present disclosure provides an array substrate which includes a light-emitting area and a non-light-emitting area. The array substrate comprises:

a substrate;

a gate insulating layer comprising a first gate insulating layer and a second gate insulating layer disposed on the substrate in sequence; and a storage capacitor disposed in the light-emitting area and comprising a first transparent electrode and a second transparent electrode;

wherein the first transparent electrode is disposed between the first gate insulating layer and the second gate insulating layer, and the second transparent electrode is disposed on the second gate insulating layer and opposite to the first transparent electrode.

In an embodiment of the present disclosure, an orthographic projection of the first transparent electrode on the substrate coincides with an orthographic projection of the second transparent electrode on the substrate.

In an embodiment of the present disclosure, the array substrate further comprises a pixel electrode disposed on one side of the second transparent electrode away from the substrate and electrically connected to the second transparent electrode.

In an embodiment of the present disclosure, the array substrate further comprises a control chip disposed on one side of the substrate away from the gate insulating layer and electrically connected to the first transparent electrode.

In an embodiment of the present disclosure, wherein the first gate insulating layer is made of silicon nitride, and the second gate insulating layer is made of silicon oxide.

In an embodiment of the present disclosure, wherein a thickness of the first gate insulating layer ranges from 300 Å to 10000 Å, and a thickness of the second gate insulating layer ranges from 500 Å to 6000 Å.

In an embodiment of the present disclosure, the array substrate further comprises:

a gate electrode disposed between the substrate and the first gate insulating layer;

an active layer disposed on the second gate insulating layer, wherein the active layer and the second transparent electrode are disposed on a same layer;

source/drain electrodes disposed on the second gate insulating layer and the active layer; and a passivation layer disposed on the gate insulating layer and covering the source electrode, the drain electrode, the active layer, the second transparent electrode, and the second gate insulating layer, wherein the passivation layer is provided with a contact hole, the pixel electrode is disposed on the passivation layer and electrically connected to the second transparent electrode through the contact hole;

wherein the gate electrode, the active layer, and the source/drain electrodes are all disposed in the non-light-emitting area.

In an embodiment of the present disclosure, wherein a thickness of the gate electrode ranges from 500 Å to 2000 Å.

In an embodiment of the present disclosure, wherein a thickness of the active layer ranges from 100 Å to 1000 Å.

According to the above technical object, the present disclosure further provides a display panel which comprises the above array substrate.

According to the above technical object, the present disclosure further provides a manufacturing method of an array substrate including a light-emitting area and a non-light-emitting area. The method comprises following steps:

providing a substrate;

forming a first gate insulating layer on the substrate;

forming a first transparent electrode on the first gate insulating layer of the light-emitting area;

forming a second gate insulating layer on the first transparent electrode and the first gate insulating layer; and forming a second transparent electrode on the second gate insulating layer of the light-emitting area;

wherein the first transparent electrode and the second transparent electrode form a storage capacitor, and the first transparent electrode is disposed opposite to the second transparent electrode.

In an embodiment of the present disclosure, the method further comprises following steps:

forming a gate electrode on the substrate of the non-light-emitting area, and forming the first gate insulating layer on the gate electrode and the substrate;

forming an active layer on the second gate insulating layer of the non-light-emitting area and preparing the active layer and the second transparent electrode on a same layer;

forming source/drain electrodes on the second gate insulating layer and the active layer of the non-light-emitting area;

forming a passivation layer on the active layer, the source/drain electrodes, the second transparent electrode, and the second gate insulating layer; and forming a pixel electrode on the passivation layer;

wherein the passivation layer is provided with a contact hole, and the pixel electrode is electrically connected to the second transparent electrode through the contact hole.

In an embodiment of the present disclosure, wherein the step of forming an active layer on the second gate insulating layer of the non-light-emitting area and preparing the active layer and the second transparent electrode on a same layer, comprises following steps:

forming a semiconductor layer covering the second gate insulating layer on the second gate insulating layer;

coating a photoresist on the semiconductor layer, wherein the photoresist comprises an unexposed region, a partially exposed region, and a completely exposed region;

performing complete exposure and development on the photoresist in the completely exposed region to make the photoresist in the completely exposed region removed and the semiconductor layer revealed; performing partial exposure and development on the photoresist in the partially exposed region to make a thickness of the photoresist in the partially exposed region become less; performing complete exposure and development on the photoresist in the completely exposed region to make the photoresist in the completely exposed region removed and the semiconductor layer revealed; performing partial exposure and development on the photoresist in the partially exposed region to make a thickness of the photoresist in the partially exposed region become less;

etching the semiconductor layer in the completely exposed region;

performing an ashing process on the photoresist outside the completely exposed region to make the photoresist in the partially exposed region removed and a thickness of the photoresist in the unexposed region become less; and conductorizing the semiconductor layer in the partially exposed region to form the second transparent electrode, and stripping the photoresist in the unexposed region, wherein the semiconductor layer in the unexposed region is the active layer.

Beneficial Effect:

The array substrate of the present disclosure includes a light-emitting area and a non-light-emitting area. The array substrate comprises: a substrate; a gate insulating layer comprising a first gate insulating layer and a second gate insulating layer disposed on the substrate in sequence; and a storage capacitor disposed in the light-emitting area and comprising a first transparent electrode and a second transparent electrode; wherein the first transparent electrode is disposed between the first gate insulating layer and the second gate insulating layer, and the second transparent electrode is disposed on the second gate insulating layer and opposite to the first transparent electrode. The array substrate of the present disclosure is to dispose the first transparent electrode in the gate insulating layer that prevents the first transparent electrode to react with a material of the first gate insulating layer and to cause bad phenomenon during the process of depositing first gate insulating layer, thereby improving yield of array substrates. In addition, the first transparent electrode disposed in the gate insulating layer reduces a distance from the first transparent electrode to the second transparent electrode. Because the storage capacitor is formed by the first transparent electrode and the second transparent electrode, reducing the distance between the two can improve capacitance of the storage capacitor. The first transparent electrode is not electrically connected to the gate electrode, and its area is reduced, thereby reducing capacitance area and improving aperture ratio and resolution of pixels. In the display panel of the present disclosure, the storage capacitor has high capacitance and small capacitance area, thereby pixel aperture ratio is improved and resolution when display is high.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
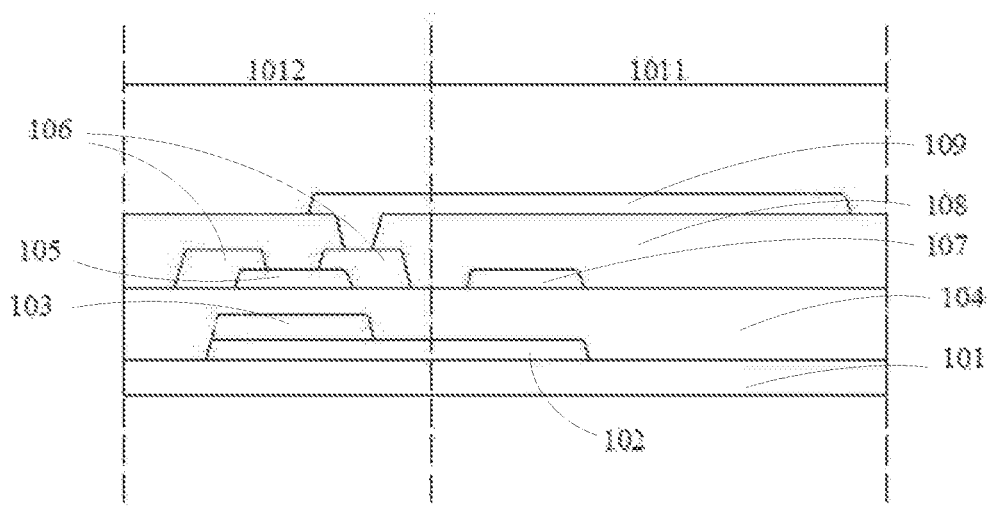
FIG. 1 is a schematic structural diagram of current array substrate.

The specific structural and functional details disclosed herein are merely representative and are for purposes of describing exemplary embodiments of the present disclosure. The present disclosure, however, may be embodied in many alternative forms, which should not be construed as causing limitations to the present disclosure.

In the description of the present disclosure, it should be understood that terms such as "center", "lateral", "upper", "lower", "left", "right", "vertical", "horizontal", "top", "bottom", "inside", "outside", as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure. In addition, terms such as "first" and "second" are used herein for purposes of description and are not intended to indicate or imply relative importance or implicitly indicating the number of technical features indicated. Thus, features limited by "first" and "second" are intended to indicate or imply including one or more than one these features. In the description of the present disclosure, "a plurality of" relates to two or more than two, unless otherwise specified. In addition, the term "comprises" and its variations are intended to cover a non-exclusive inclusion.

In the description of the present disclosure, it should be noted that unless there are express rules and limitations, the terms such as "mount," "connect," and "bond" should be comprehended in broad sense. For example, it can mean a permanent connection, a detachable connection, or an integrate connection; it can mean a mechanical connection, an electrical connection, or can communicate with each other; it can mean a direct connection, an indirect connection by an intermediate, or an inner communication or an inter-reaction between two elements. A person skilled in the art should understand the specific meanings in the present disclosure according to specific situations.

The terminology used herein is for the purpose of describing particular embodiments and is not intended to limit the exemplary embodiments. The singular forms "a", "an" are also intended to include the plural, unless otherwise specified. It is also to be understood that the terms "comprise" and/or "include" specify described features, integers, steps, operations, units, and/or components without excluding one or more other features, integers, steps, operations, units, components, and/or combinations thereof.

The embodiments of the present disclosure are described in detail hereinafter. Examples of the described embodiments are given in the accompanying drawings.

Referring to FIG. 1, current array substrates can be divided into a light-emitting area 1011 and a non-light-emitting area 1012. The array substrate includes a substrate 101, a first transparent electrode 102, a gate electrode 103, a gate insulating layer 104, an active layer 105, source/drain electrodes 106, a second transparent electrode 107, a passivation layer 108, and a pixel electrode 109 which are disposed on the substrate 101. Wherein the first transparent electrode 102 is electrically connected to the gate electrode 103 and disposed under the gate electrode 103 and the first transparent electrode 102 is disposed in the non-light-emitting area 1012 and the light-emitting area 1011. The capacitor area thereof is greater and the gate electrode 103 is opaque that cause pixel aperture ratio to decrease. The gate insulating layer 104 is made of silicon nitride, so the plasma beam easily reacts with the first transparent electrode 102 during the process of depositing silicon nitride, thereby causing bad phenomenon and affecting display of products.

Because a capacitor area is greater and thin film transistors are opaque in current array substrates, current array substrates have a technical problem of decreased aperture ratio, thereby causing products having low resolution and bad phenomenon. An embodiment of the present disclosure can solve the defect.

Figure 2:
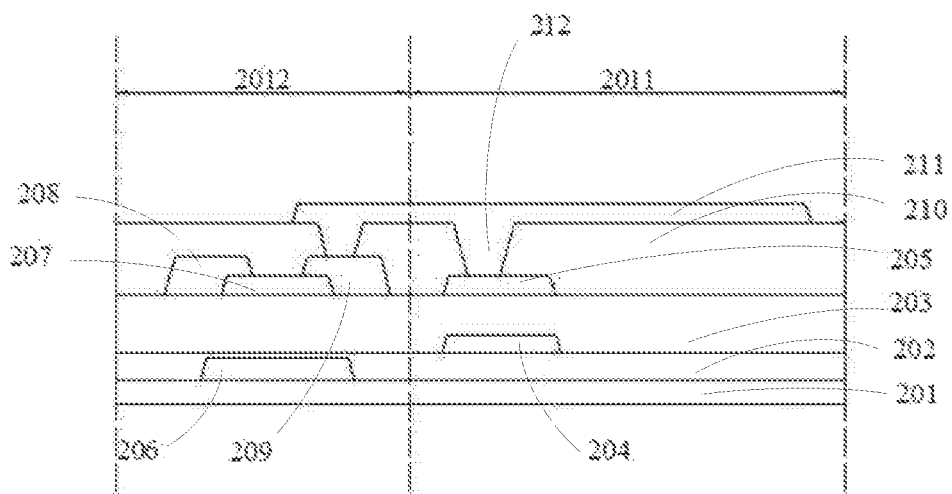
FIG. 2 is a schematic structural diagram of an array substrate according to an embodiment of the present disclosure.
Figure 3:
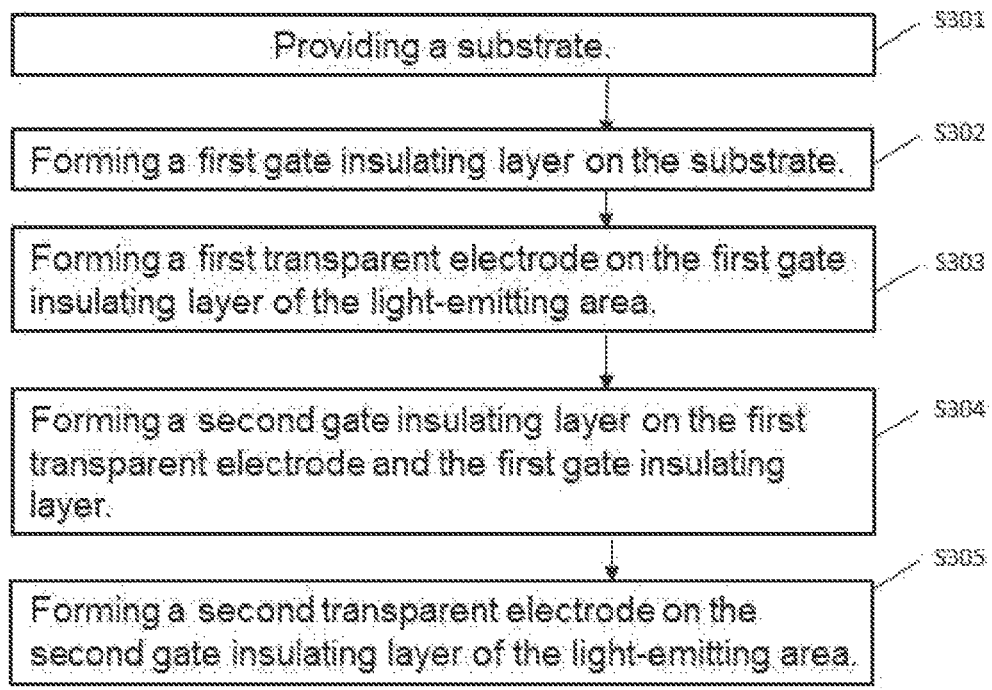
FIG. 3 is a flowchart of a manufacturing method of an array substrate according to an embodiment of the present disclosure.
Figure 4A:
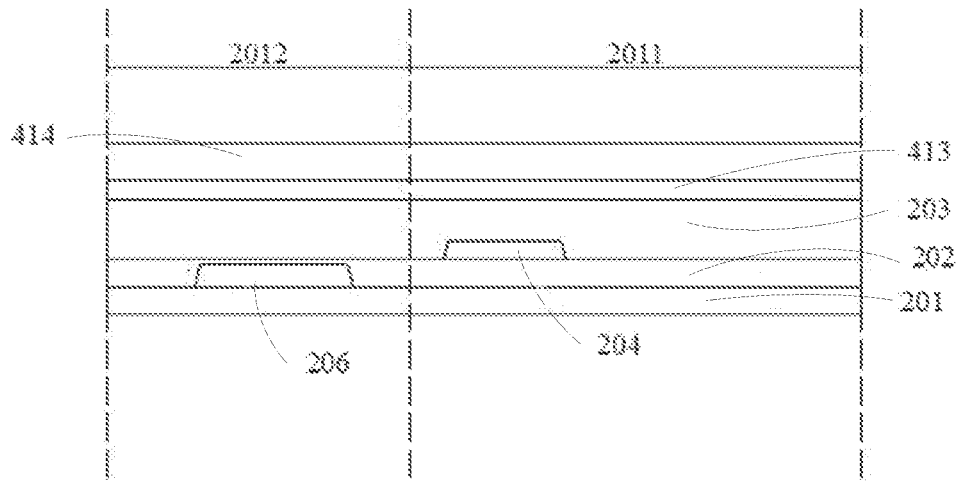
FIG. 4A to FIG. 4F are schematic structural diagrams of an array substrate when preparing an active layer and a second transparent electrode according to an embodiment of the present disclosure.
Figure 4B:
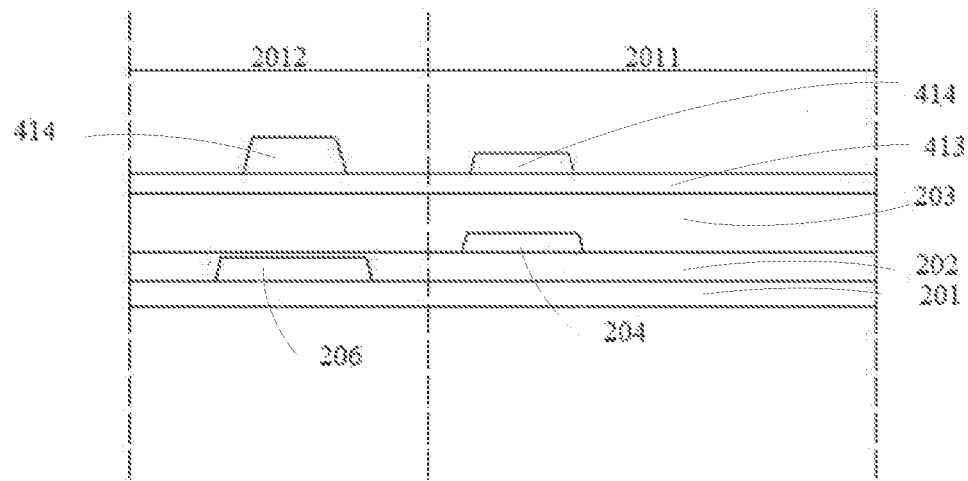
Figure 4C:
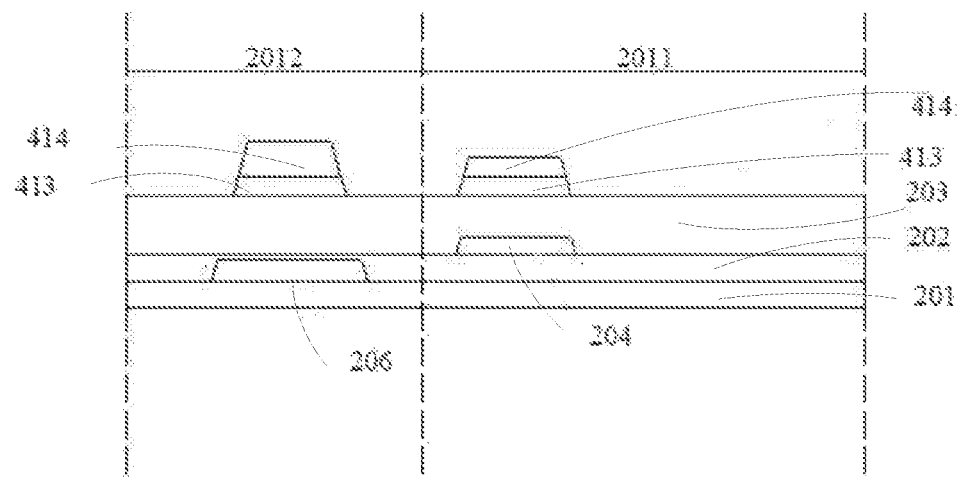
Figure 4D:
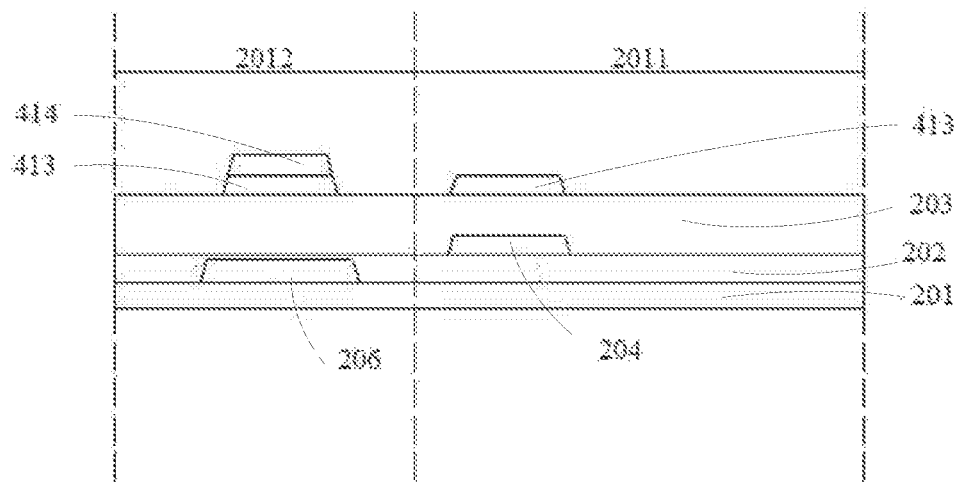
Figure 4E:
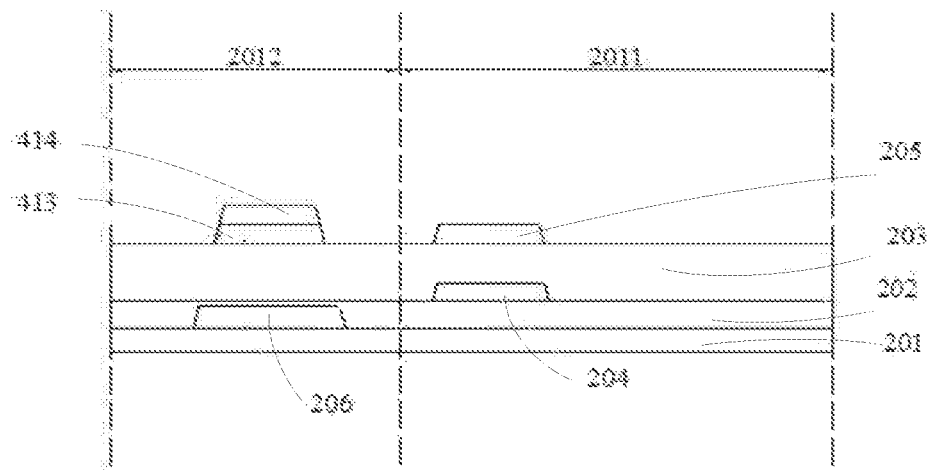
Figure 4F:
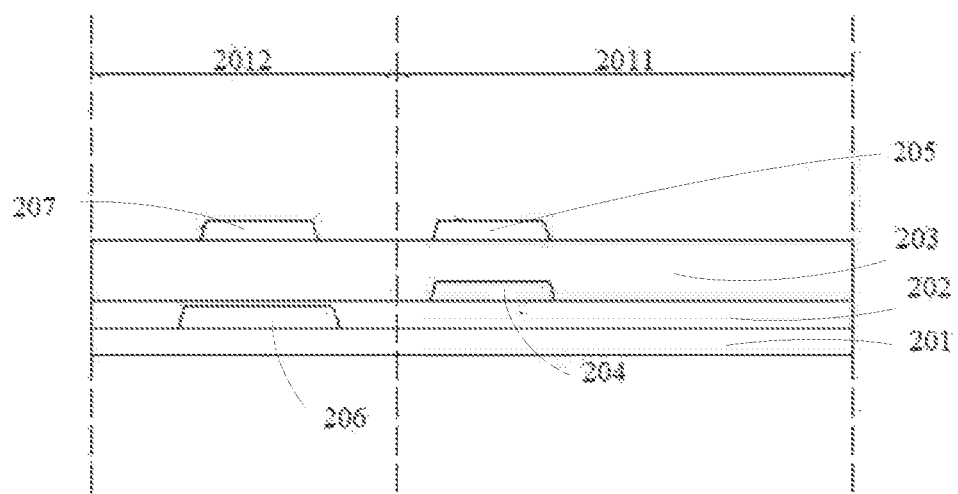

As shown in FIG. 2, the array substrate provided by an embodiment of the present disclosure includes a light-emitting area 2011 and a non-light-emitting area 2012. The array substrate comprises a substrate 201; a gate insulating layer comprising a first gate insulating layer 202 and a second gate insulating layer 203 disposed on the substrate in sequence; and a storage capacitor disposed in the light-emitting area and comprising a first transparent electrode 204 and a second transparent electrode 205; wherein the first transparent electrode 204 is disposed between the first gate insulating layer 202 and the second gate insulating layer 203, and the second transparent electrode 205 is disposed on the second gate insulating layer 203 and opposite to the first transparent electrode 204.

Specifically, the array substrate further comprises a gate electrode 206 disposed on the substrate 201, wherein the first gate insulating layer 202 is disposed on the substrate 201 and the gate electrode 206, the first transparent electrode 204 is disposed on the first gate insulating layer 202 of the light-emitting area, and the second gate insulating layer 203 is disposed on the first transparent electrode 204 and the first gate insulating layer 202; an active layer 207 disposed on the second gate insulating layer 203 of the non-light-emitting area; and source/drain electrodes comprising a source electrode 208 and a drain electrode 209. The source electrode 208 and the drain electrode 209 are respectively disposed on both sides of the active layer 207, and part of the source electrode 208 and part of the drain electrode 209 are disposed on the active layer 207 to electrically connected to the active layer 207.

Further, an orthographic projection of the first transparent electrode 204 on the substrate 201 does not coincide with orthographic projections of the gate electrode 206, the source/drain electrode, and the active layer 207 on the substrate 201, and the orthographic projection of the first transparent electrode 204 on the substrate 201 coincides with an orthographic projection of the second transparent electrode 205 on the substrate 201. That is, thin film transistors of the array substrate are all disposed in the non-light-emitting area 2012, and the first transparent electrode 204 and the second transparent electrode 205 are not only corresponding in position but equal in size. The first transparent electrode 204 is a bottom electrode of the storage capacitor, and the second transparent electrode 205 is a top electrode of the storage capacitor. The second gate insulating layer 203 is disposed between the first transparent electrode 204 and the second transparent electrode 205 to form the storage capacitor. It should be noted that, an area where the storage capacitor is located is incorporated into the light-emitting area 2011, so when the light-emitting area 2011 is working, the first transparent electrode 204 and the second transparent electrode 205 can transmit light without the thin film transistors affecting light to transmit, thereby improving pixel aperture ratio. In addition, the area of the storage capacitor is reduced, and meanwhile, the first transparent electrode 204 is disposed between the first gate insulating layer 202 and the second gate insulating layer 203 which reduces the distance between the first transparent electrode 204 and the second transparent electrode 205, thereby improving capacitance of the storage capacitor and then improving resolution.

Wherein the gate electrode 206 is a metal layer, and the metal material of the gate electrode 206 can be copper/molybdenum or copper/titanium molybdenum. The gate electrode 206 can be a metal wiring. The first gate insulating layer 202 is made of silicon nitride, the second gate insulating layer 203 is made of silicon oxide, and the first transparent electrode 204 is one or more selected from the group consisting of indium tin oxide (ITO) and indium zinc oxide (IZO). The second transparent electrode 205 is an oxide semiconductor channel layer after conductorization. The oxide semiconductor can be one or more selected from the group consisting of indium gallium zinc oxide (IGZO), indium zinc tin oxide (IZTO), and indium gallium zinc tin oxide (IGZTO). The first gate insulating layer 202 works as a diffusion barrier layer and a protective layer of the gate electrode 206. The first transparent electrode 204 is located between the first gate insulating layer 202 and the second gate insulating layer 203 to prevent ITO or IZO in the first transparent electrode 204 to react with silicon nitride when depositing the gate insulating layer, thereby improving product yield.

The first transparent electrode 204 is not electrically connected to the gate electrode 206, and is electrically connected to a control chip (not shown in the figure). The control chip is connected to the first transparent electrode 204 by a metal wiring, and the control chip makes the first transparent electrode 204 maintain a fixed voltage.

In an embodiment of the present disclosure, the array substrate further comprises: a passivation layer 210 disposed on the gate insulating layer and covering the source electrode 208, the drain electrode 209, the active layer 207, the second transparent electrode 205, and the second gate insulating layer 203; and a pixel electrode 211 disposed on the passivation layer 210. Wherein, the passivation layer 210 is provided with a contact hole 212 in an area corresponding to the drain electrode 209 and the second transparent electrode 205 when depositing. The pixel electrode 211 is electrically connected to the drain electrode 209 and the second transparent electrode 205 through the contact hole 212. The drain electrode 209 is electrically connected to the pixel electrode 211, that is, the thin film transistors can control voltages of the pixel through the pixel electrode 211. An insulated passivation layer is disposed between the second transparent electrode 205 and the pixel electrode 211 to prevent a parasitic capacitance, which affects display, to be produced between the two when the second transparent electrode 205 is electrically connected to the pixel electrode 211.

It needs to noted that, the array substrate in the embodiment is a bottom gate type array substrate, but the storage capacitor setting method of the present disclosure can also be applied to a top gate type array substrate to improve pixel aperture ratio, resolution, and product yield.

In an embodiment of the present disclosure, in the array substrate, the gate insulating layer is set as two layers. The first gate insulating layer is made of silicon nitride, and the second gate insulating layer is made of silicon oxide. The storage capacitor is disposed in the light-emitting area, and the storage capacitor uses transparent electrodes. The first transparent electrode is disposed between the first gate insulating layer and the second gate insulating layer to prevent a reaction between the first transparent electrode and silicon nitride in the first gate insulating layer, resulting in poor products. The second transparent electrode is disposed opposite to the first transparent electrode with a same size, thereby increasing capacitance value of the storage capacitor, reducing the capacitance area, and then improving aperture ratio and resolution of the pixel.

The present disclosure further provides a display panel. The display panel provided in the embodiment comprises the above array substrate. The display panel can be a liquid crystal display panel or an OLED display panel. The working principle of the display panel is the same as that of the array substrate provided in the above embodiment. For details, it can be referred to the working principle of the array substrate in the above embodiment, which is not described herein.

Referring to FIG. 3, and FIG. 4A to FIG. 4F, the present disclosure further provides a manufacturing method of an array substrate including the light-emitting area 2011 and the non-light-emitting area 2012. The method comprises following steps:

S301: providing a substrate 201.

The substrate 201 may be a glass substrate. The substrate 201 should be washed many times before preparing other film layers.

S302: forming a first gate insulating layer 202 on the substrate 201.

Before forming the first gate insulating layer 202, the gate electrode 206 should be deposited on the substrate 201 of the non-light-emitting area 2012. The gate electrode 206 can be a metal layer, and a thickness of the metal layer ranges from 500 Å to 2000 Å. The gate electrode 206 can be used as a metal wiring of a pixel. The first gate insulating layer 202 is disposed on the gate electrode 206 and the substrate 201. Material of the first gate insulating layer 202 is silicon nitride, and a thickness of the first gate insulating layer 202 ranges from 300 Å to 10000 Å. The first gate insulating layer 202 works as a diffusion barrier layer and a protective layer of the gate electrode 206.

S303: forming a first transparent electrode 204 on the first gate insulating layer 202 of the light-emitting area 2011.

The first transparent electrode 204 is not electrically connected to the gate electrode 206, and is electrically connected to a control chip by a wiring. The control chip is disposed on one side of the substrate 201 away from the first transparent electrode 204. The control chip provides a stable voltage to the first transparent electrode 204. The first transparent electrode 204 is one or more selected from the group consisting of indium tin oxide (ITO) and indium zinc oxide (IZO).

S304: forming a second gate insulating layer 203 on the first transparent electrode 204 and the first gate insulating layer 202.

The material of the second gate insulating layer 203 is silicon oxide, so it won't react with indium tin oxide or indium zinc oxide when depositing. A thickness of the second gate insulating layer 203 ranges from 500 Å to 6000 Å.

S305: forming a second transparent electrode 205 on the second gate insulating layer 203 of the light-emitting area 2011.

Form an active layer 207 on the second gate insulating layer 203 of the non-light-emitting area 2012 at the same time when forming the second transparent electrode 205. The active layer 207 is prepared in the same layer as the second transparent electrode 205. The active layer 207 is a metal oxide semiconductor layer. Material of the semiconductor is one or more selected from the group consisting of indium gallium zinc oxide (IGZO), indium zinc tin oxide (IZTO), and indium gallium zinc tin oxide (IGZTO). A thickness of the active layer 207 ranges from 100 Å to 1000 Å. The second transparent electrode 205 is the metal oxide semiconductor after conductorization.

Preparing the active layer 207 and the second transparent electrode 205 on the same layer can be achieved by photolithography. Referring to FIG. 4A to FIG. 4F, the specific steps are as follows: forming a semiconductor layer 413 covering the second gate insulating layer 203 on the second gate insulating layer 203, wherein the semiconductor layer 413 is a metal oxide semiconductor layer, such as one or more selected from the group consisting of indium gallium zinc oxide (IGZO), indium zinc tin oxide (IZTO), and indium gallium zinc tin oxide (IGZTO); coating a photoresist 414 on the semiconductor layer 413, wherein the photoresist 414 comprises an unexposed region, a partially exposed region, and a completely exposed region; performing complete exposure and development on the photoresist 414 in the completely exposed region to make the photoresist 414 in the completely exposed region removed and the semiconductor layer 413 revealed; performing partial exposure and development on the photoresist 414 in the partially exposed region to make a thickness of the photoresist 414 in the partially exposed region become less; conductorizing the semiconductor layer 413 in the partially exposed region to form the second transparent electrode 205, and stripping the photoresist in the unexposed region, wherein the semiconductor layer 413 in the unexposed region is the active layer 207.

After finishing the above steps, forming source/drain electrodes on the second gate insulating layer and the active layer of the non-light-emitting area. Wherein the source/drain electrodes may be metals or alloys of copper, aluminum, molybdenum, titanium, etc., the source/drain electrodes have a thickness ranging from 2000 Å to 10000 Å, and the source/drain electrodes include a source electrode and a drain electrode. The source electrode and the the drain electrode are disposed on both sides of the active layer, and are electrically connected to the active layer. Forming a passivation layer on the active layer, the source/drain electrodes, the second transparent electrode, and the second gate insulating layer; and forming a pixel electrode on the passivation layer. Wherein the passivation layer is provided with a contact hole, and the pixel electrode is electrically connected to the drain electrode and the second transparent electrode through the contact hole. The drain electrode is electrically connected to the pixel electrode, that is, the thin film transistors can control voltages of the pixel through the pixel electrode. An insulated passivation layer is disposed between the second transparent electrode and the pixel electrode to prevent a parasitic capacitance, which affects display, to be produced between the two when the second transparent electrode is electrically connected to the pixel electrode.

In the array substrate, the first transparent electrode 204 and the second transparent electrode 205 form a storage capacitor, and the first transparent electrode 204 is disposed opposite to the second transparent electrode 205. In addition, an orthographic projection of the first transparent electrode 204 on the substrate 201 does not coincide with orthographic projections of the gate electrode 206, the source/drain electrode, and the active layer 207 on the substrate 201, and the orthographic projection of the first transparent electrode 204 on the substrate 201 coincides with an orthographic projection of the second transparent electrode 205 on the substrate 201. That is, thin film transistors of the array substrate are all disposed in the non-light-emitting area 2012, and the first transparent electrode 204 and the second transparent electrode 205 are not only corresponding in position but equal in size. The first transparent electrode 204 is a bottom electrode of the storage capacitor, and the second transparent electrode 205 is a top electrode of the storage capacitor. The second gate insulating layer 203 is disposed between the first transparent electrode 204 and the second transparent electrode 205 to form the storage capacitor. It should be noted that, an area where the storage capacitor is located is incorporated into the light-emitting area 2011, so when the light-emitting area 2011 is working, the first transparent electrode 204 and the second transparent electrode 205 can transmit light without the thin film transistors affecting light to transmit, thereby improving pixel aperture ratio. In addition, the area of the storage capacitor is reduced, and meanwhile, the first transparent electrode 204 is disposed between the first gate insulating layer 202 and the second gate insulating layer 203 which reduces the distance between the first transparent electrode 204 and the second transparent electrode 205, thereby improving capacitance of the storage capacitor and then improving resolution.

In the manufacturing method according to an embodiment of the present disclosure, using photolithography to prepare the active layer and the second transparent electrode on the same layer can ideally improve resolution.

The array substrate of the present disclosure includes a light-emitting area and a non-light-emitting area. The array substrate comprises: a substrate; a gate insulating layer comprising a first gate insulating layer and a second gate insulating layer disposed on the substrate in sequence; and a storage capacitor disposed in the light-emitting area and comprising a first transparent electrode and a second transparent electrode; wherein the first transparent electrode is disposed between the first gate insulating layer and the second gate insulating layer, and the second transparent electrode is disposed on the second gate insulating layer and opposite to the first transparent electrode. The array substrate of the present disclosure is to dispose the first transparent electrode in the gate insulating layer that prevents the first transparent electrode to react with a material of the first gate insulating layer and to cause bad phenomenon during the process of depositing first gate insulating layer, thereby improving yield of array substrates. In addition, the first transparent electrode disposed in the gate insulating layer reduces a distance from the first transparent electrode to the second transparent electrode. Because the storage capacitor is formed by the first transparent electrode and the second transparent electrode, reducing the distance between the two can improve capacitance of the storage capacitor. The first transparent electrode is not electrically connected to the gate electrode, and its area is reduced, thereby reducing capacitance area and improving aperture ratio and resolution of pixels. In the display panel of the present disclosure, the storage capacitor has high capacitance and small capacitance area, thereby pixel aperture ratio is improved and resolution when display is high.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. An array substrate including a light-emitting area and a non-light-emitting area, comprising:
   a substrate;
   a gate insulating layer comprising a first gate insulating layer and a second gate insulating layer disposed on the substrate in sequence;
   an active layer disposed on the second gate insulating layer; and
   a storage capacitor disposed in the light-emitting area and comprising a first transparent electrode and a second transparent electrode;
   wherein the first transparent electrode is disposed between the first gate insulating layer and the second gate insulating layer, the second transparent electrode is disposed on the second gate insulating layer and opposite to the first transparent electrode, and the active layer and the second transparent electrode are disposed on a same layer.

2. The array substrate according to claim 1, wherein an orthographic projection of the first transparent electrode on the substrate coincides with an orthographic projection of the second transparent electrode on the substrate.

3. A display panel, comprising the array substrate according to claim 1.

4. The array substrate according to claim 1, wherein the first gate insulating layer is made of silicon nitride, and the second gate insulating layer is made of silicon oxide.

5. The array substrate according to claim 4, wherein a thickness of the first gate insulating layer ranges from 300 Å to 10000 Å, and a thickness of the second gate insulating layer ranges from 500 Å to 6000 Å.

6. The array substrate according to claim 1, comprising a pixel electrode disposed on one side of the second transparent electrode away from the substrate and electrically connected to the second transparent electrode.

7. The array substrate according to claim 6, comprising:
a gate electrode disposed between the substrate and the first gate insulating layer;
a source electrode and a drain electrode disposed on the second gate insulating layer and the active layer; and
a passivation layer disposed on the gate insulating layer and covering the source electrode, the drain electrode, the active layer, the second transparent electrode, and the second gate insulating layer, wherein the passivation layer is provided with a contact hole, and the pixel electrode is disposed on the passivation layer and electrically connected to the second transparent electrode through the contact hole;
wherein the gate electrode, the active layer, the source electrode, and the drain electrode are all disposed in the non-light-emitting area.

8. The array substrate according to claim 7, wherein a thickness of the gate electrode ranges from 500 Å to 2000 Å.

9. The array substrate according to claim 7, wherein a thickness of the active layer ranges from 100 Å to 1000 Å.

10. A manufacturing method of an array substrate including a light-emitting area and a non-light-emitting area, comprising following steps:
providing a substrate;
forming a first gate insulating layer on the substrate;
forming a first transparent electrode on the first gate insulating layer of the light-emitting area;
forming a second gate insulating layer on the first transparent electrode and the first gate insulating layer;
forming a second transparent electrode on the second gate insulating layer of the light-emitting area; and
forming an active layer on the second gate insulating layer of the non-light-emitting area and preparing the active layer and the second transparent electrode on a same layer;
wherein the first transparent electrode and the second transparent electrode form a storage capacitor, and the first transparent electrode is disposed opposite to the second transparent electrode.

11. The manufacturing method of the array substrate according to claim 10, comprising following steps:
forming a gate electrode on the substrate of the non-light-emitting area, and forming the first gate insulating layer on the gate electrode and the substrate;
forming a source electrode and a drain electrode on the second gate insulating layer and the active layer of the non-light-emitting area;
forming a passivation layer on the active layer, the source electrode, the drain electrode, the second transparent electrode, and the second gate insulating layer; and
forming a pixel electrode on the passivation layer;
wherein the passivation layer is provided with a contact hole, and the pixel electrode is electrically connected to the second transparent electrode through the contact hole.

12. The manufacturing method of the array substrate according to claim 11, wherein the step of forming an active layer on the second gate insulating layer of the non-light-emitting area and preparing the active layer and the second transparent electrode on a same layer, comprises following steps:
forming a semiconductor layer covering the second gate insulating layer on the second gate insulating layer;
coating a photoresist on the semiconductor layer, wherein the photoresist comprises an unexposed region, a partially exposed region, and a completely exposed region;
performing complete exposure and development on the photoresist in the completely exposed region to make the photoresist in the completely exposed region removed and the semiconductor layer revealed; performing partial exposure and development on the photoresist in the partially exposed region to make a thickness of the photoresist in the partially exposed region become less;
etching the semiconductor layer in the completely exposed region;
performing an ashing process on the photoresist outside the completely exposed region to make the photoresist in the partially exposed region removed and a thickness of the photoresist in the unexposed region become less; and
conductorizing the semiconductor layer in the partially exposed region to form the second transparent electrode, and stripping the photoresist in the unexposed region, wherein the semiconductor layer in the unexposed region is the active layer.

* * * * *